US012775037B2

(12) United States Patent
Longman et al.

(10) Patent No.: US 12,775,037 B2
(45) Date of Patent: Oct. 27, 2026

(54) ANECHOIC CHAMBER REFLECTION LOCALIZATION USING TRILATERATION WITH A LINEAR FREQUENCY MODULATED SIGNAL

(71) Applicant: GM Global Technology Operations LLC, Detroit, MI (US)

(72) Inventors: Oren Longman, Tel Aviv (IL); Igal Kotzer, Tel Aviv (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 156 days.

(21) Appl. No.: 18/787,055

(22) Filed: Jul. 29, 2024

(65) Prior Publication Data

US 2026/0029448 A1 Jan. 29, 2026

(51) Int. Cl.
*G01R 29/10* (2006.01)
*G01R 35/00* (2006.01)

(52) U.S. Cl.
CPC ........... *G01R 29/105* (2013.01); *G01R 35/00* (2013.01)

(58) Field of Classification Search
CPC ...... G01R 29/10; G01R 29/105; G01R 35/00; G01R 29/08; G01R 29/0821; G01R 29/0878; G01R 27/06; G01R 27/267; G01R 31/11; G01N 29/30
See application file for complete search history.

(56) References Cited

U.S. PATENT DOCUMENTS

2023/0408648 A1* 12/2023 Berneck ............. G01R 29/0871

FOREIGN PATENT DOCUMENTS

| | | | | | |
|---|---|---|---|---|---|
| DE | 102006011834 | A1 | | 2/2007 | |
| EP | 4209788 | A1 | | 7/2023 | |
| GB | 2529152 | A | * | 2/2016 | ........... H04R 29/001 |
| WO | WO-2023284964 | A1 | * | 1/2023 | ........... G01S 7/4086 |

OTHER PUBLICATIONS

German Office Action for German Application No. 102024126804.2; dated Apr. 28, 2025; 5 pages.

* cited by examiner

*Primary Examiner* — Son T Le
(74) *Attorney, Agent, or Firm* — CANTOR COLBURN LLP

(57) ABSTRACT

A system performs a method of validating an anechoic chamber. A plurality of electromagnetic waves is propagated from a transmitter located within the anechoic chamber. Each of the plurality of electromagnetic waves is associated with one of a plurality of configurations between the transmitter and a receiver in the anechoic chamber. A plurality of reflections is received at the receiver from a reflective element in the anechoic chamber. Each of the plurality of reflections corresponds to one of the plurality of configurations. For each of the plurality of reflections, an ellipse is determined indicating a range of the reflective element. An intersection point of each of the ellipses is located to determine a location of the reflective element in the anechoic chamber. A reflectivity of the reflective element is compared to a threshold to validate the anechoic chamber.

20 Claims, 4 Drawing Sheets

ANECHOIC CHAMBER REFLECTION LOCALIZATION USING TRILATERATION WITH A LINEAR FREQUENCY MODULATED SIGNAL

The subject disclosure relates to anechoic chambers, and in particular to a system and method for localizing a reflection within an anechoic chamber.

An anechoic chamber is a chamber having absorbing elements along its walls that ideally absorb energy at a range of wavelengths. A transmitter can be placed inside an anechoic chamber along with a receiver, and an electromagnetic wave can be transmitted from the transmitter to interact with the receiver. It is desired that the receiver receives only those electromagnetic waves which travel in a direct line-of-sight from the transmitter to the receiver. However, there can be reflections of the electromagnetic waves inside an anechoic chamber, such that the receiver receives both the direct line-of-sight waves and reflected waves. One reason for reflections can be metal structures inside the chamber that cannot be covered with absorbing elements. Another reason can be that the absorbing elements do not absorb enough of the wave's energy impinging on the elements (be it due to an angle issue, frequency issue or any other issue). If an absorbing element does not meet specifications or if any other reflecting element is present in the chamber, it can produce a reflection that is received at the receiver. This reflection can interfere with the testing process. Accordingly, it is desirable to provide method for testing an anechoic chamber to identify or localize any reflective elements therein.

SUMMARY

In one exemplary embodiment, a method of validating an anechoic chamber is disclosed. The method includes propagating a plurality of electromagnetic waves from a transmitter located within the anechoic chamber, wherein each of the plurality of electromagnetic waves is associated with one of a plurality of configurations between the transmitter and a receiver in the anechoic chamber, receiving a plurality of reflections at the receiver from a reflective element in the anechoic chamber, wherein each of the plurality of reflections corresponds to one of the plurality of configurations, determining, for each of the plurality of reflections, an ellipse indicating a range of the reflective element, locating an intersection point of each of the ellipses to determine a location of the reflective element in the anechoic chamber, and comparing a reflectivity of the reflective element to a threshold to validate the anechoic chamber.

In addition to one or more of the features described herein, the plurality of configurations includes one of the receiver at a single receiver location and the transmitter at a plurality of transmitter locations and the transmitter at a single transmitter location and the receiver at a plurality of receiver locations.

In addition to one or more of the features described herein, one of the plurality of transmitter locations is along a half circle having the single receiver location at its center and the plurality of receiver locations is along the half circle having the single transmitter location at its center.

In addition to one or more of the features described herein, the method further includes determining a product of a reflection received at the receiver and a reference signal from the transmitter and applying a Blackman-Harris window to the product.

In addition to one or more of the features described herein, the method further includes determining the reflectivity of the reflective element based on a ratio of a first power of a signal received from the reflective element at the receiver and a second power of a transmitter signal.

In addition to one or more of the features described herein, the method further includes determining the reflectivity of the reflective element based on a ratio of a first power of a signal received at the receiver from the reflective element to a second power of a signal received at the receiver directly from the transmitter.

In addition to one or more of the features described herein, the method further includes obtaining a calibration for the anechoic chamber based on the reflective element and correcting a subsequent testing of a device under test in the anechoic chamber using the calibration.

In another exemplary embodiment, a method of testing a device under test using an anechoic chamber is disclosed. The method includes propagating a plurality of electromagnetic waves from a transmitter located within the anechoic chamber, wherein each of the plurality of electromagnetic waves is associated with one of a plurality of configurations between the transmitter and a receiver in the anechoic chamber, receiving a plurality of reflections at the receiver from a reflective element in the anechoic chamber, wherein each of the plurality of reflections corresponds to one of the plurality of configurations, determining, for each of the plurality of reflections, an ellipse indicating a range of the reflective element, locating an intersection point of each of the ellipses to determine a location of the reflective element in the anechoic chamber, comparing a reflectivity of the reflective element to a threshold to obtain a calibration of the anechoic chamber, placing the device under test within the anechoic chamber, and correcting a subsequent testing of the device under test in the anechoic chamber using the calibration.

In addition to one or more of the features described herein, the plurality of configurations includes one of the receiver at a single receiver location and the transmitter at a plurality of transmitter locations and the transmitter at a single transmitter location and the receiver at a plurality of receiver locations.

In addition to one or more of the features described herein, one of the plurality of transmitter locations is along a half circle having the single receiver location at its center and the plurality of receiver locations is along the half circle having the single transmitter location at its center.

In addition to one or more of the features described herein, the method further includes determining a product of a reflection received at the receiver and a reference signal from the transmitter and applying a Blackman-Harris window to the product.

In addition to one or more of the features described herein, the method further includes determining the reflectivity of the reflective element based on a ratio of a first power of a signal received from the reflective element at the receiver and a second power of a transmitter signal.

In addition to one or more of the features described herein, the method further includes determining the reflectivity of the reflective element based on a ratio of a first power of a signal received at the receiver from the reflective element to a second power of a signal received at the receiver directly from the transmitter.

In yet another exemplary embodiment, a system for validating an anechoic chamber is disclosed. The system includes a transmitter within the anechoic chamber, a receiver within the anechoic chamber, the receiver movable within the anechoic chamber between a plurality of receiver locations to form a plurality of configurations between the transmitter and the receiver, and a processor. The processor is configured to activate the transmitter to transmit an electromagnetic wave for each configuration between the transmitter and the receiver, receive a reflection at the receiver from a reflective element in response to each electromagnetic wave transmitted by the transmitter within the anechoic chamber, wherein each reflection corresponds to one of the plurality of configurations, determine a range ellipse corresponding to each reflection, the range ellipse indicating a range of the reflective element, locate an intersection point of each of the range ellipses to determine a location of the reflective element in the anechoic chamber, and compare a reflectivity of the reflective element to a threshold to validate the anechoic chamber.

In addition to one or more of the features described herein, the plurality of configurations includes one of the receiver at a single receiver location and the transmitter at a plurality of transmitter locations and the transmitter at a single transmitter location and the receiver at a plurality of receiver locations.

In addition to one or more of the features described herein, one of the plurality of transmitter locations is along a half circle having the single receiver location at its center and the plurality of receiver locations is along the half circle having the single transmitter location at its center.

In addition to one or more of the features described herein, the processor is further configured to determine a product of the received reflection and a reference signal from the transmitter and applying a Blackman-Harris window to the product.

In addition to one or more of the features described herein, the processor is further configured to determine the reflectivity of the reflective element based on a ratio of a first power of a signal received from the reflective element at the receiver and a second power of a transmitter signal.

In addition to one or more of the features described herein, the processor is further configured to determine the reflectivity of the reflective element based on a ratio of a first power of a signal received at the receiver from the reflective element to a second power of a signal received at the receiver directly from the transmitter.

In addition to one or more of the features described herein, the processor is further configured to obtain a calibration for the anechoic chamber based on the reflective element and correct a subsequent testing of a device under test in the anechoic chamber using the calibration.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
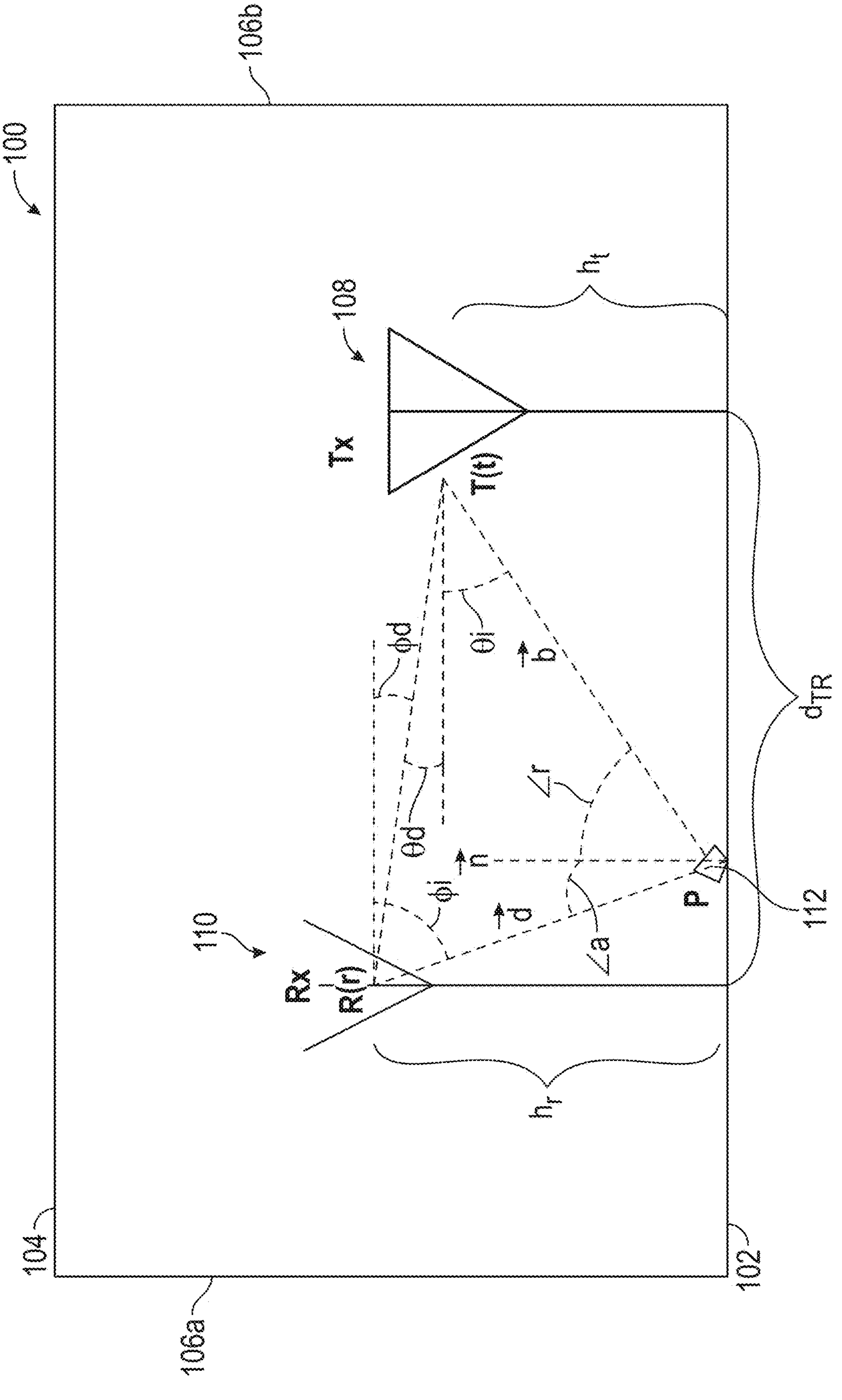
FIG. 1 is a diagram of an anechoic chamber in a side cross-sectional view.

The following description is merely exemplary in nature and is not intended to limit the present disclosure, its application or uses. It should be understood that throughout the drawings, corresponding reference numerals indicate like or corresponding parts and features.

FIG. 1 is a diagram of an anechoic chamber 100 in a side cross-sectional view. For ease of explanation, the anechoic chamber 100 is selected to be in the shape of a rectangular cuboid having six inner surfaces. However, this is not meant to be a limitation of the anechoic chamber. In other embodiments, the anechoic chamber 100 can have another number of surfaces at different orientations.

The diagram shows various sides of the anechoic chamber 100, including a floor 102, a ceiling 104, a front surface **106*a* and a rear surface 106*b*. A transmitter 108 (Tx) is located at a transmitter location T(t) and a receiver 110 (Rx) is located at a receiver location R(r). A reflective element 112 is shown for illustrative purposes at a reflection point P along the floor 102 of the anechoic chamber 100. In an embodiment, the reflective element 112 can be an absorbing element that has a reflectivity that exceeds a specification for the absorbing element. The reflective element 112 can also be a portion of the absorbing element that exceeds specification. The reflective element 112** can also be a metallic material or any other material that reflects electromagnetic waves.

The transmitter 108 and the receiver 110 are separated from each other by a separation distance $d_{TR}$. The transmitter 108 is placed at a height $h_t$ above the floor 102 and the receiver 110 is placed at a height $h_r$ above the floor. The transmitter 108 propagates an electromagnetic wave that is received at the receiver 110. The received signal can be a direct signal that travels directly from the transmitter 108 to the receiver 110. The received signal can also include a reflection from the reflective element 112. A path vector between the transmitter 108 and the reflective element 112 is shown in Eq. (1):

$$\vec{r}=\vec{a}+\lambda\vec{b} \qquad \text{Eq. (1)}$$

where $\vec{a}$ is the position vector of the transmitter position, $\vec{b}$ is a vector pointing from the transmitter 108 to the reflective element 112, and lambda is a real number (i.e., a scalar parameter for the line equation). A path vector between the reflective element 112 and the receiver 110 is given as shown in Eq. (2):

$$\vec{r}=\vec{c}+\lambda\vec{d} \qquad \text{Eq. (2)}$$

where $\vec{c}$ is the position vector of the receiver position, $\vec{d}$ is a vector pointing from the reflective element 112 to the receiver 110, and lambda is a real number (i.e., a scalar parameter for the line equation).

A normal vector $\vec{n}$ is perpendicular to an inner surface of the anechoic chamber 100 (e.g., floor 102). The reflective element 112 can be a planar surface oriented at a non-zero angle to the surface of the side of the anechoic chamber. Thus, an angle of incidence at the reflective element is different than an angle ∠a measured with respect to the normal vector $\vec{n}$ and an angle of reflection at the reflective element 112 is different than an angle ∠r measured with respect to the normal vector $\vec{n}$. The angle ∠a between the transmitted wave and the normal vector $\vec{n}$ is shown in Eq. (3):

$$\angle a = \frac{\pi}{2} - \cos^{-1}\left|\frac{\vec{b}\cdot\vec{n}}{|\vec{b}||\vec{n}|}\right| \quad \text{Eq. (3)}$$

whereas the angle ∠r between the reflective wave and the normal vector $\vec{n}$ is given as shown in Eq. (4)

$$\angle r = \frac{\pi}{2} - \cos^{-1}\left|\frac{\vec{d}\cdot\vec{n}}{|\vec{d}||\vec{n}|}\right| \quad \text{Eq. (4)}$$

Figure 2:
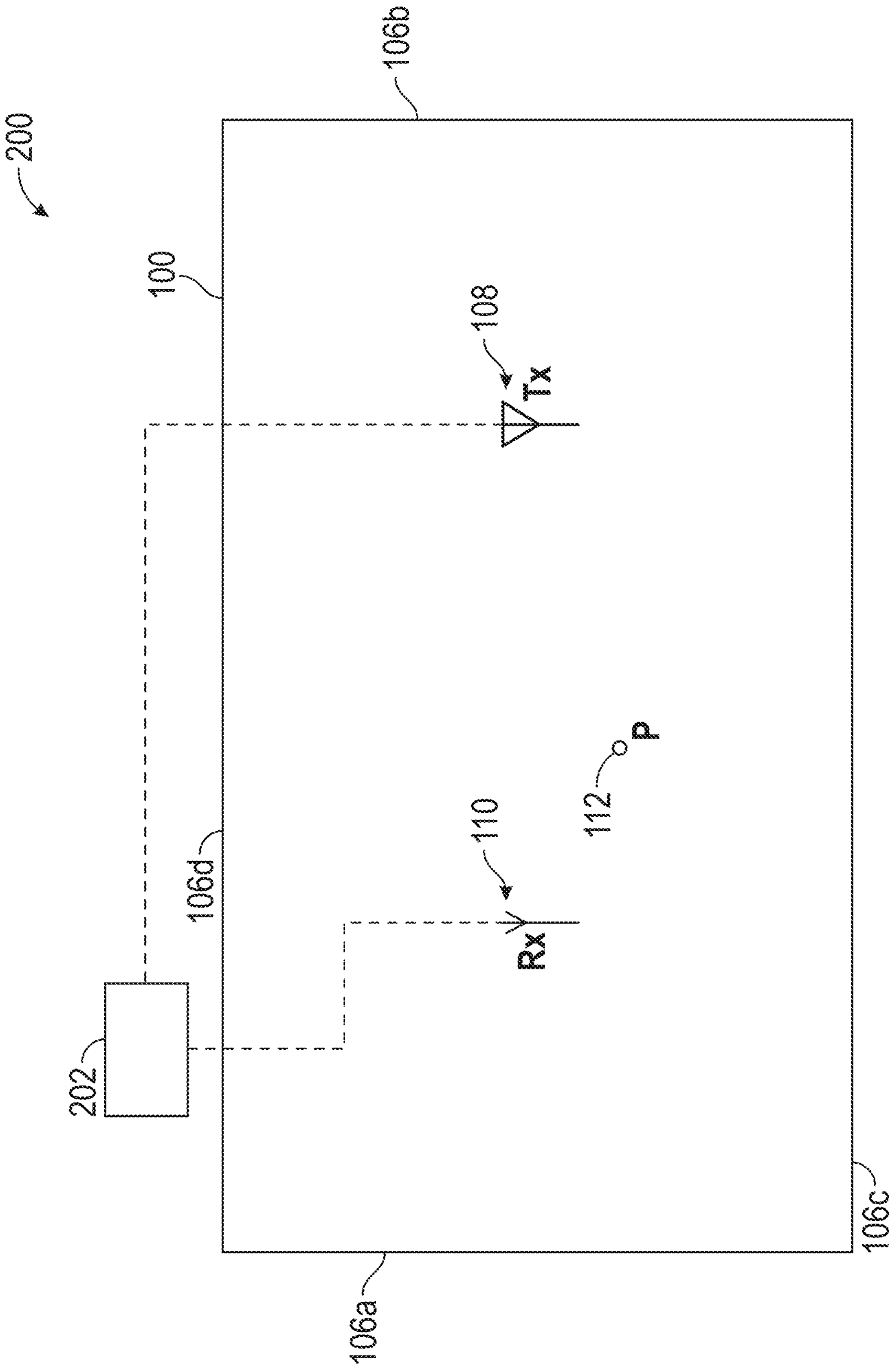
FIG. 2 is a diagram showing a top view of the anechoic chamber of FIG. 1.

FIG. 2 is a diagram 200 showing a top view of the anechoic chamber 100. The diagram 200 shows the front surface 106*a*, the rear surface 106*b*, a left surface 106*c* and a right surface 106*d*. The diagram 200 also shows a controller 202 that can be used to perform the calculations disclosed herein. The controller 202 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The controller 202 may also include a non-transitory computer-readable medium that stores instructions which are processed by one or more processors of the controller to locate one or more a reflective elements within the an echoic chamber and use information obtained on the one or more a reflective elements to calibrate the anechoic chamber or to correct for subsequent tests made on a device under test.

Figure 3:
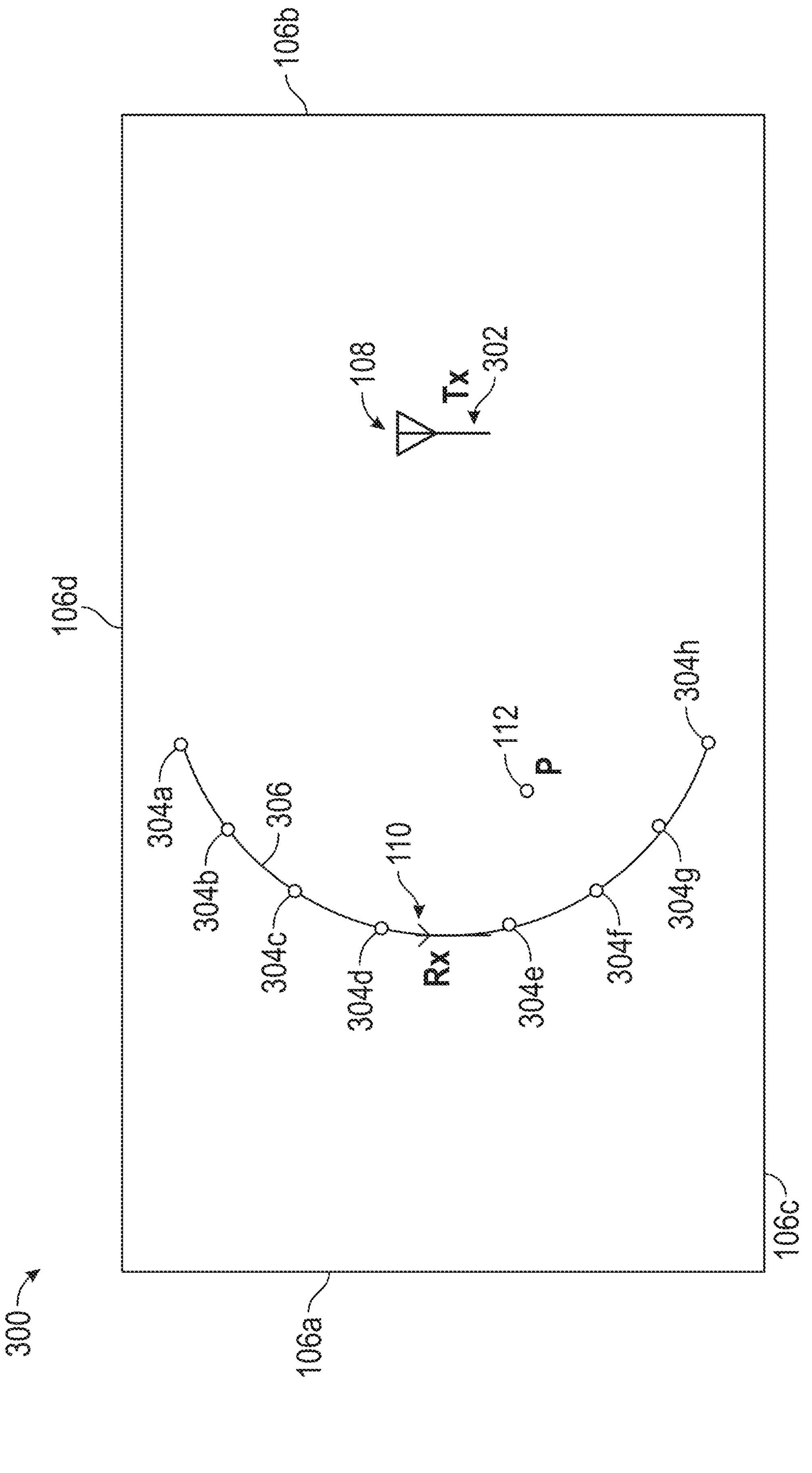
FIG. 3 is a diagram of the top view of the anechoic chamber showing different relative positions or configurations between the transmitter and the receiver, in an illustrative embodiment.

FIG. 3 is a diagram 300 of the top view of the anechoic chamber showing different relative positions or configurations between the transmitter 108 and the receiver 110, in an illustrative embodiment. The transmitter 108 is located at a single transmitter location 302, while the receiver 110 is movable between a plurality of receiver locations 304*a*-304*h* with respect to the transmitter 108. In an embodiment, the plurality of receiver locations 304*a*-304*h* is located along a half circle 306 and the single transmitter location 302 is the center of the half circle. The plurality of receiver locations 304*a*-304*h* can be evenly spaced along the half circle 306.

For each receiver location, the transmitter 108 can propagate an electromagnetic wave and the receiver 110 can record a reflection of the electromagnetic wave from the chamber (e.g., from the reflective element 112). Each of the recorded reflections can be processed to determine a range and power of the reflection. This range and power can be used to validate the adherence of the anechoic chamber to specifications, using the methods disclosed herein.

In another embodiment, the receiver 110 can be located at a single receiver location and the transmitter 108 can moved between a plurality of transmitter locations. The plurality of transmitter locations can be located along a half-circle having the receiver location as its center. In yet another embodiment, the separation distance $d_{TR}$ can be varied through a plurality of configurations and signal measurements can be obtained at each of the configurations. In various embodiments, any form of 3-dimensional movement of either the transmitter 108 or the receiver 110 within the chamber is considered.

Figure 4:
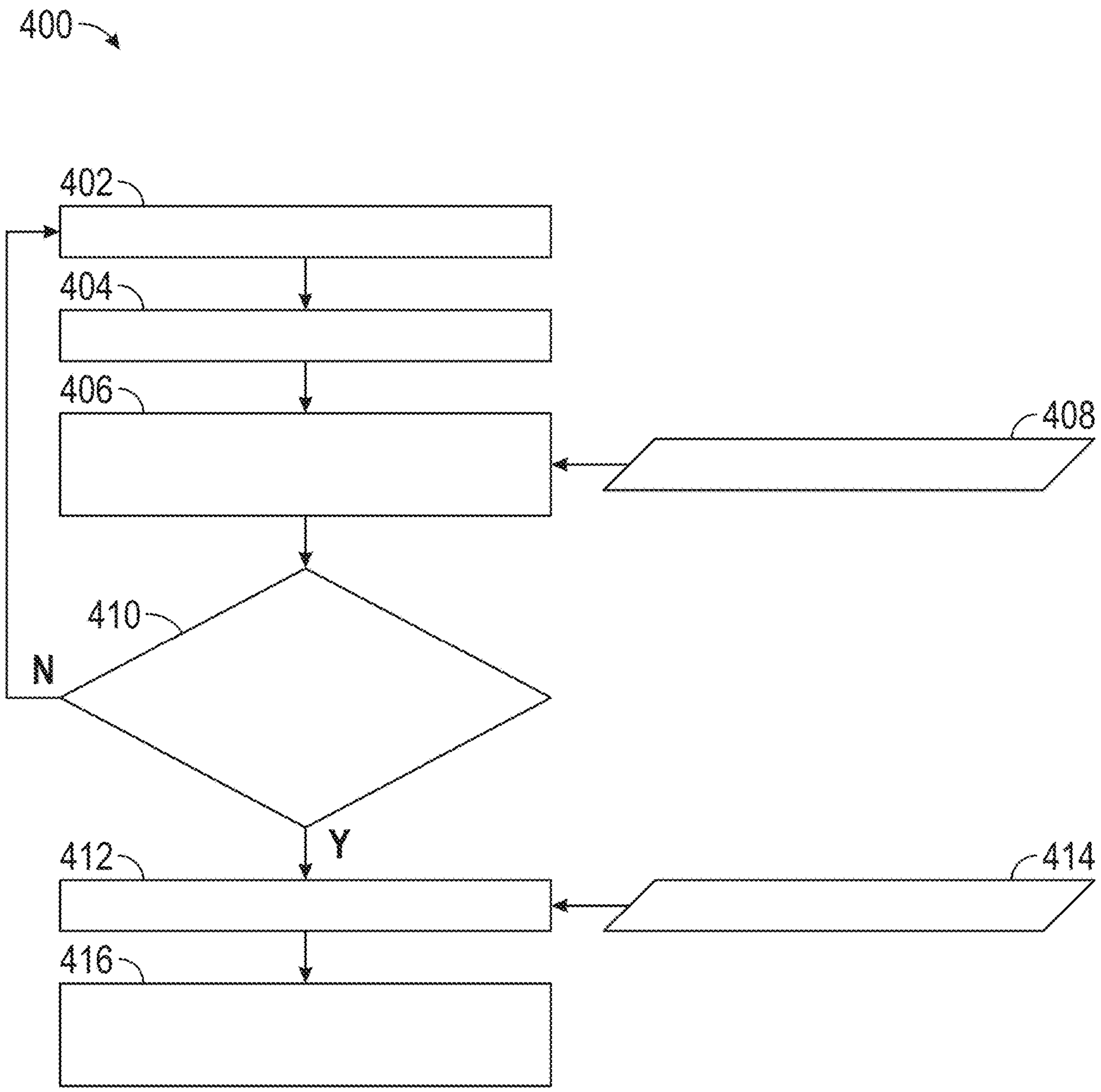
FIG. 4 is a flowchart of a method for validating an anechoic chamber, in an illustrative embodiment.

FIG. 4 is a flowchart 400 of a method for validating an anechoic chamber, in an illustrative embodiment. For illustrative purposes, the method is discussed with respect to FIG. 3. In box 402, the transmitter and the receiver are set to a first transmitter-receiver configuration. For example, the transmitter is placed at the transmitter location and the receiver is placed at a first receiver location. In box 404, a linear frequency modulated signal (i.e., a chirp signal) is transmitted from the transmitter. In box 406, the chirp signal (or a reflection of the chirp signal or a combination of both the signal and the reflected signal) is received at the receiver 110 and processed using stretch processing. The stretch processing involves convoluting the received signal with an LFM reference signal (box 408), as discussed herein. An alternative approach to stretch processing for range estimation is by measuring the frequency response of the reflections and performing an inverse fast Fourier transform on the frequency response.

In box 410, a completion check is performed to determine if a reflection has been received and processed for each of the receiver locations. If signals have not been received and processed at all of the receiver locations, the method returns to box 402 and the receiver is moved to another receiver location. Returning to box 410, if a signal has been received and processed at all of the receiver locations, the method proceeds to box 412. In box 412, the processed reflections are used in a trilateration process to determine a range or location of a reflective element in the chamber. The trilateration is performed using a chamber geometry (box 414) which can be previously determined.

In box 416, the results of the trilateration are used to validate the chamber against the specifications for the chamber. The validation can include comparing a power of a signal reflected from the reflective element against a power threshold. The results can also be used to calibrate the chamber for use in subsequent testing of a device under test in the chamber.

The signal transmission of box 404 is now discussed. The transmitter transmits a chirp signal, which is given mathematically in Eq. (6):

$$x(t) = \exp\left\{-2\pi j\left(f_c + \frac{1}{2}\alpha t\right)t\right\},\ 0 \le t \le T_c \quad \text{Eq. (6)}$$

where x(t) is the chirp signal, $f_c$ is a carrier frequency of the chirp signal, α is a chirp slope, t is time, and $T_c$ is a chirp duration. The signal is generated, amplified and split into two signals. The first signal is sent to the transmitter 108, where it is transmitted and propagated into the anechoic chamber 100. The second signal is sent to and recorded at the controller as a reference signal $x_{ref}(t)$. The reference signal is used for subsequent stretch processing.

The stretch processing of box 406 is now discussed. A received signal $x_{r_x}(t)$ is received at the receiver 110. The signal can be a direct signal or a reflected signal, such as reflected at reflection point RP. Stretch processing is performed on the received signal. A first step of the stretch processing includes sampling the received signal $x_{r_x}(t)$ at a sampling frequency $f_s$, as shown in Eq. (7):

$$x_{r_x}[n] = x_{r_x}(nT_s) \quad \text{Eq. (7)}$$

where $x_{r_x}[n]$ is the sampled signal, n is the sample index, and $T_s$ is the sampling interval. In a second step, the sampled signal is multiplied by a conjugate of the reference signal, as shown in Eq. (8):

$$y[n] = x_{r_x}[n]x^*_{ref}[n] \quad \text{Eq. (8)}$$

where $$x^*_{ref}[n]$$

is the conjugate of the reference signal and y[n] is product of the multiplication. A third step includes multiplying the product obtained in Eq. (8) by a window function, as shown in Eq. (9):

$$z[n] = w[n]y[n] \quad \text{Eq. (9)}$$

where w[n] is the window function and z[n] is the window product. In an embodiment, the window function w[n] can be the Blackman-Harris window. The fourth step includes taking the Fourier transform of the window product z[n] to obtain a range for the receiver, as shown in Eq. (10):

$$r[n] = FFT(z[n]) \quad \text{Eq. (10)}$$

where r[n] is the range. The range r[n] is determined with a range bin size of c/B, where c is the speed of light and $B=\alpha T_c$ is the chirp bandwidth. A range resolution for the signal is given by Eq. (11):

$$\Delta R = w\frac{c}{B} \quad \text{Eq. (11)}$$

where w is a widening coefficient originating from the windowing operation.

The stretch process can be performed using either raw data processing or detection processing. For raw data processing, the range r[n] is saved for further processing. For detection processing, thresholding is performed on r[n] and the resulting detections {r} are saved. A fixed threshold is used due to the low ambient noise in the anechoic chamber.

The trilateration process of box 412 is now discussed. Once multiple range signals have been obtained, each range signal being associated with a separate receiver location for the receiver. A receiver location is given by Eq. (12):

$$R[r] = (x_r, y_r, z_r) \quad \text{Eq. (12)}$$

and a transmitter location is given by Eq. (13):

$$T[t] = (x_t, y_t, z_t) \quad \text{Eq. (13)}$$

A range signal is denoted by $r_{rt}[n]$ where the location index r refers to the receiver location and the location index t refers to the transmitter location.

The anechoic chamber 100 is modeled as a set of surfaces $P_i$. Each surface can be modeled either analytically or numerically. The analytical model includes representing a surface $P_i$ using a plane equation, as shown in Eq. (14):

$$P_i = Ax + By + Cz + D = 0 \quad \text{Eq. (14)}$$

where $P_i$ is the analytical representation of the plane. A trivial chamber has 6 planes or walls, where $P_i$ has indices i=[0, . . . , 5].

A numerical model includes representing a plane as a set of points on a grid, as shown in Eq. (15):

$$P_i = \{(x, y, z)\} \quad \text{Eq. (15)}$$

wherein $P_i$ is the numerical representation of the plane. An $n^{th}$ range r[n] is represented by an ellipsoid. The focal points of the ellipsoid are located at the transmitter location and the receiver location. The generalized equation for an ellipsoid is shown in Eq. (16):

$$ax^2 + by^2 + cz^2 + dxy + eyz + fzx + gx + hy + iz + j = 0 \quad \text{Eq. (16)}$$

An intersection of the ellipsoid with a plane forms an ellipse.

Trilateration is performed using either a raw data processing approach or a detection processing approach. In the raw data processing approach, a grid X of the chamber is set by converting an analytical representation of the surface $P_i$ to a numerical representation: $X=\{P_i\}$. A corresponding power vector W is initialized for each point in the grid X with value 0.

An ellipsoid for a range $$n\frac{f_s c T_c}{\alpha T_s}$$

is intersected with the grid X, thereby adding the value of $|r_{rt}[n]|$ to the corresponding intersection points in W. This is performed for all receiver-transmitter configurations. The points in grid X where W is greater than a threshold are identified as reflection points.

In a detection processing approach, each detection $\{r\}_{rt}$ with range $$n\frac{f_s c T_c}{\alpha T_s}$$

is intersected with a surface of the chamber, resulting in a ellipse $\{e\}_{rt}$. Ellipses from each transmitter-receiver configuration are reviewed to determine an intersection point in common with each ellipse. In an embodiment, the intersections can be clustered using Density-Based Spatial Clustering of Applications with Noise (DBSCAN). A cluster is considered valid when a number of items in the cluster is above a threshold and the L2 norm of the cluster from its mean point is below a threshold. If the cluster is valid, the method declares a reflection point at the mean point.

The reflectivity $\rho_i$ of the reflection point can be estimated based on a ratio of a power of a first signal (reflection signal) received from the reflective element at the receiver and a power of a second signal (transmitter signal), as shown in Eq. (17):

$$\rho_i(\angle a, \angle r) = \frac{p_{rt}[n]\lambda^2}{p_t G_t(\theta_i) G_r(\phi_i)(4\pi)^3 R_a^2 R_r^2} \quad \text{Eq. (17)}$$

where the angle ∠a and the angle ∠r are derived from the location of the transmitter 208, the receiver 210 and the reflection point RP, $p_{rt}[n]$ is the receiver power corresponding to reflection $r_{rt}[n]$, $p_t$ is the transmitter power, $G_t$ is the transmitter antenna gain, $G_r$ is the receiver antenna gain, $\theta_i$ is the angle between the transmitter antenna and the reflection point, $\phi_i$ is the angle between the receiver antenna and the reflection point, $R_a$ is the distance between the transmitter antenna and the reflection point, and $R_r$ is the distance between the receiver antenna and the reflection point.

Alternatively, the reflectivity can be estimated based on a ratio of a first signal power of a first signal received at the receiver from the reflective element to a second power of a second signal (a direct path signal) received at the receiver directly from the transmitter, as shown in Eq. (18):

$$\rho_i(\angle a, \angle r) = \frac{|r_{rt}[n]|^2}{|r_{rt}[0]|^2} \frac{G_t(\theta_d) G_r(\phi_d) R_a^2 R_r^2}{G_t(\theta_i) G_r(\phi_i) R_d^2} \quad \text{Eq. (18)}$$

where $r_{rt}[n]$ is the actual received signal power from an indirect wave (reflected wave) and $r_{rt}[0]$ is the signal power for a directly received wave, $\theta_d$ is the angle between the transmitter and the receiver with respect to the transmitter antenna orientation, $\phi_d$ is the angle between the receiver and the transmitter with respect to the receiver antenna orientation, and $R_d$ is the distance between the transmitter antenna and the receiver antenna.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of validating an anechoic chamber, comprising:

propagating a plurality of electromagnetic waves from a transmitter located within the anechoic chamber, wherein each of the plurality of electromagnetic waves is associated with one of a plurality of configurations between the transmitter and a receiver in the anechoic chamber;

receiving a plurality of reflections at the receiver from a reflective element in the anechoic chamber, wherein each of the plurality of reflections corresponds to one of the plurality of configurations;

determining, for each of the plurality of reflections, an ellipse indicating a range of the reflective element;

locating an intersection point of each of the ellipses to determine a location of the reflective element in the anechoic chamber;

determining a reflectivity of the reflective element based on a ratio of a first power of a signal received from the reflective element at the receiver and a second power of a transmitter signal; and comparing the reflectivity of the reflective element to a threshold to validate the anechoic chamber.

2. The method of claim 1, wherein the plurality of configurations includes one of: (i) the receiver at a single receiver location and the transmitter at a plurality of transmitter locations; and (ii) the transmitter at a single transmitter location and the receiver at a plurality of receiver locations.

3. The method of claim 2, wherein one of: (i) the plurality of transmitter locations is along a half circle having the single receiver location at its center; and (ii) the plurality of receiver locations is along the half circle having the single transmitter location at its center.

4. The method of claim 1, further comprising determining a product of a reflection received at the receiver and a reference signal from the transmitter and applying a Blackman-Harris window to the product.

5. The method of claim 1, further comprising obtaining a calibration for the anechoic chamber based on the reflective element and correcting a subsequent testing of a device under test in the anechoic chamber using the calibration.

6. A method of validating an anechoic chamber, comprising:

propagating a plurality of electromagnetic waves from a transmitter located within the anechoic chamber, wherein each of the plurality of electromagnetic waves is associated with one of a plurality of configurations between the transmitter and a receiver in the anechoic chamber;

receiving a plurality of reflections at the receiver from a reflective element in the anechoic chamber, wherein each of the plurality of reflections corresponds to one of the plurality of configurations;

determining, for each of the plurality of reflections, an ellipse indicating a range of the reflective element;

locating an intersection point of each of the ellipses to determine a location of the reflective element in the anechoic chamber;

determining a reflectivity of the reflective element based on a ratio of a first power of a first signal received at the receiver from the reflective element to a second power of a second signal received at the receiver directly from the transmitter; and comparing the reflectivity of the reflective element to a threshold to validate the anechoic chamber.

7. The method of claim 6, further comprising obtaining a calibration for the anechoic chamber based on the reflective element and correcting a subsequent testing of a device under test in the anechoic chamber using the calibration.

8. A method of testing a device under test using an anechoic chamber, comprising:

propagating a plurality of electromagnetic waves from a transmitter located within the anechoic chamber, wherein each of the plurality of electromagnetic waves is associated with one of a plurality of configurations between the transmitter and a receiver in the anechoic chamber;

receiving a plurality of reflections at the receiver from a reflective element in the anechoic chamber, wherein each of the plurality of reflections corresponds to one of the plurality of configurations;

determining, for each of the plurality of reflections, an ellipse indicating a range of the reflective element;

locating an intersection point of each of the ellipses to determine a location of the reflective element in the anechoic chamber;

determining a reflectivity of the reflective element based on a ratio of a first power of a signal received from the reflective element at the receiver and a second power of a transmitter signal; and comparing the reflectivity of the reflective element to a threshold to obtain a calibration of the anechoic chamber;

placing the device under test within the anechoic chamber; and correcting a subsequent testing of the device under test in the anechoic chamber using the calibration.

9. The method of claim 8, wherein the plurality of configurations includes one of: (i) the receiver at a single receiver location and the transmitter at a plurality of transmitter locations; and (ii) the transmitter at a single transmitter location and the receiver at a plurality of receiver locations.

10. The method of claim 9, wherein one of: (i) the plurality of transmitter locations is along a half circle having the single receiver location at its center; and (ii) the plurality of receiver locations is along the half circle having the single transmitter location at its center.

11. The method of claim 8, further comprising determining a product of a reflection received at the receiver and a reference signal from the transmitter and applying a Blackman-Harris window to the product.

12. A method of testing a device under test using an anechoic chamber, comprising:

propagating a plurality of electromagnetic waves from a transmitter located within the anechoic chamber, wherein each of the plurality of electromagnetic waves is associated with one of a plurality of configurations between the transmitter and a receiver in the anechoic chamber;

receiving a plurality of reflections at the receiver from a reflective element in the anechoic chamber, wherein each of the plurality of reflections corresponds to one of the plurality of configurations;

determining, for each of the plurality of reflections, an ellipse indicating a range of the reflective element;

locating an intersection point of each of the ellipses to determine a location of the reflective element in the anechoic chamber;

determining a reflectivity of the reflective element based on a ratio of a first power of a first signal received at the receiver from the reflective element to a second power of a second signal received at the receiver directly from the transmitter;

comparing the reflectivity of the reflective element to a threshold to obtain a calibration of the anechoic chamber;

placing the device under test within the anechoic chamber; and correcting a subsequent testing of the device under test in the anechoic chamber using the calibration.

13. The method of claim 12, wherein the plurality of configurations includes one of: (i) the receiver at a single receiver location and the transmitter at a plurality of transmitter locations; and (ii) the transmitter at a single transmitter location and the receiver at a plurality of receiver locations.

14. A system for validating an anechoic chamber, comprising:

a transmitter within the anechoic chamber;

a receiver within the anechoic chamber, the receiver movable within the anechoic chamber between a plurality of receiver locations to form a plurality of configurations between the transmitter and the receiver;

a processor configured to:

activate the transmitter to transmit an electromagnetic wave for each configuration between the transmitter and the receiver;

receive a reflection at the receiver from a reflective element in response to each electromagnetic wave transmitted by the transmitter within the anechoic chamber, wherein each reflection corresponds to one of the plurality of configurations;

determine a range ellipse corresponding to each reflection, the range ellipse indicating a range of the reflective element;

locate an intersection point of each of the range ellipses to determine a location of the reflective element in the anechoic chamber;

determine the reflectivity of the reflective element based on a ratio of a first power of a signal received from the reflective element at the receiver and a second power of a transmitter signal; and compare a reflectivity of the reflective element to a threshold to validate the anechoic chamber.

15. The system of claim 14, wherein the plurality of configurations includes one of: (i) the receiver at a single receiver location and the transmitter at a plurality of transmitter locations; and (ii) the transmitter at a single transmitter location and the receiver at the plurality of receiver locations.

16. The system of claim 15, wherein one of: (i) the plurality of transmitter locations is along a half circle having the single receiver location at its center; and (ii) the plurality of receiver locations is along the half circle having the single transmitter location at its center.

17. The system of claim 14, wherein the processor is further configured to determine a product of the received reflection and a reference signal from the transmitter and applying a Blackman-Harris window to the product.

18. The system of claim 14, wherein the processor is further configured to obtain a calibration for the anechoic chamber based on the reflective element and correct a subsequent testing of a device under test in the anechoic chamber using the calibration.

19. A system for validating an anechoic chamber, comprising:

a transmitter within the anechoic chamber;

a receiver within the anechoic chamber, the receiver movable within the anechoic chamber between a plurality of receiver locations to form a plurality of configurations between the transmitter and the receiver;

a processor configured to:

activate the transmitter to transmit an electromagnetic wave for each configuration between the transmitter and the receiver;

receive a reflection at the receiver from a reflective element in response to each electromagnetic wave transmitted by the transmitter within the anechoic chamber, wherein each reflection corresponds to one of the plurality of configurations;

determine a range ellipse corresponding to each reflection, the range ellipse indicating a range of the reflective element;

locate an intersection point of each of the range ellipses to determine a location of the reflective element in the anechoic chamber;

determine the reflectivity of the reflective element based on a ratio of a first power of a first signal received at the receiver from the reflective element to a second power of a second signal received at the receiver directly from the transmitter; and compare a reflectivity of the reflective element to a threshold to validate the anechoic chamber.

20. The system of claim 19, wherein the processor is further configured to obtain a calibration for the anechoic chamber based on the reflective element and correct a subsequent testing of a device under test in the anechoic chamber using the calibration.

* * * * *